United States Patent
Ohashi et al.

(10) Patent No.: US 9,812,301 B2
(45) Date of Patent: *Nov. 7, 2017

(54) TUNGSTEN SINTERED COMPACT SPUTTERING TARGET AND METHOD FOR PRODUCING SAME

(71) Applicant: JX Nippon Mining & Metals Corporation, Tokyo (JP)

(72) Inventors: Kazumasa Ohashi, Ibaraki (JP); Takeo Okabe, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/654,568

(22) PCT Filed: Mar. 20, 2014

(86) PCT No.: PCT/JP2014/057646
§ 371 (c)(1),
(2) Date: Jun. 22, 2015

(87) PCT Pub. No.: WO2014/148588
PCT Pub. Date: Sep. 25, 2014

(65) Prior Publication Data
US 2015/0357170 A1   Dec. 10, 2015

(30) Foreign Application Priority Data
Mar. 22, 2013   (JP) .................................. 2013-060159

(51) Int. Cl.
*H01J 37/34*   (2006.01)
*C23C 14/34*   (2006.01)
(Continued)

(52) U.S. Cl.
CPC .......... *H01J 37/3426* (2013.01); *C22C 27/04* (2013.01); *C23C 14/3414* (2013.01); *C22C 1/045* (2013.01); *C23C 14/165* (2013.01)

(58) Field of Classification Search
CPC ............... C23C 14/165; C23C 14/3414; H01J 37/3426; H01J 37/3429; C22C 27/04; C22C 1/045; B22F 2301/20
See application file for complete search history.

(56) References Cited

U.S. PATENT DOCUMENTS

| | | |
|---|---|---|
| 6,582,535 B1 | 6/2003 | Suzuki et al. |
| 8,118,984 B2 | 2/2012 | Suzuki |
| (Continued) | | |

FOREIGN PATENT DOCUMENTS

| | | |
|---|---|---|
| CN | 101748365 A | 6/2010 |
| JP | H05-093267 A | 4/1993 |
| (Continued) | | |

OTHER PUBLICATIONS

Machine Translation JP05093267A.*
(Continued)

*Primary Examiner* — Michael Band
(74) *Attorney, Agent, or Firm* — Howson & Howson LLP

(57) ABSTRACT

Provided is a tungsten sintered compact sputtering target containing iron as an impurity in an amount of 0.8 wtppm or less, and remainder being tungsten and other unavoidable impurities, wherein a range of iron concentration in a target structure is within a range of ±0.1 wtppm of an average concentration. Additionally provided is a tungsten sintered compact sputtering target, wherein a relative density of the target is 99% or higher, an average crystal grain size is 50 µm or less, and a crystal grain size range is 5 to 200 µm. The present invention aims to inhibit abnormal grain growth in (Continued)

the tungsten target by reducing the amount of iron in the tungsten sintered compact sputtering target.

1 Claim, 1 Drawing Sheet

(51) Int. Cl.
    *C22C 27/04*     (2006.01)
    *C22C 1/04*     (2006.01)
    *C23C 14/16*     (2006.01)

(56) References Cited

U.S. PATENT DOCUMENTS

| | | |
|---|---|---|
| 8,252,126 B2 | 8/2012 | Matera et al. |
| 8,500,928 B2 | 8/2013 | Matera et al. |
| 8,764,877 B2 | 7/2014 | Sato et al. |
| 2007/0243095 A1 | 10/2007 | Ivanov |
| 2011/0094879 A1 | 4/2011 | Suzuki et al. |
| 2015/0023837 A1 | 1/2015 | Ohashi et al. |
| 2015/0303040 A1 | 10/2015 | Kaminaga et al. |

FOREIGN PATENT DOCUMENTS

| | | |
|---|---|---|
| JP | H07-076771 A | 3/1995 |
| JP | H08-250427 A | 9/1996 |
| JP | 2000-256836 A | 9/2000 |
| JP | 2001-335923 A | 12/2001 |
| JP | 2005-171389 A | 6/2005 |
| JP | 2007-314883 A | 12/2007 |

OTHER PUBLICATIONS

Y. Fukasawa et al., "High-Purity Metal Sputtering Targets", Toshiba Review, vol. 43, No. 9, pp. 761-764, 1988 (month unknown) (English Translation of Section 4.2 provided).

\* cited by examiner

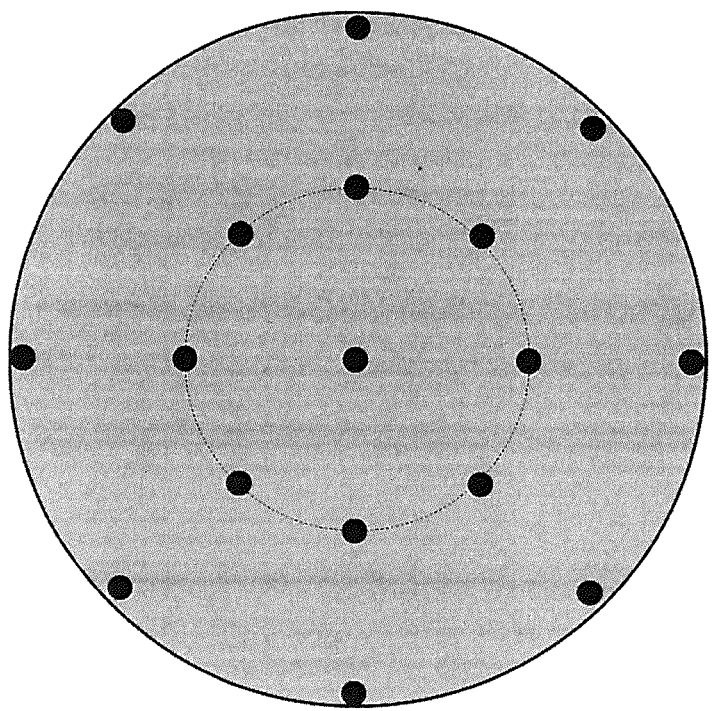

TUNGSTEN SINTERED COMPACT SPUTTERING TARGET AND METHOD FOR PRODUCING SAME

BACKGROUND

The present invention relates to a tungsten sintered compact target that is used upon forming, via the sputtering method, a gate electrode or a wiring material of an IC, LSI or the like, and to a method of producing such a tungsten sintered compact target.

In recent years, pursuant to the higher integration of very-large-scale integrated circuits ("VLSI"), studies are being conducted for using materials having lower electrical resistivity as the electrode material or the wiring material. Under the foregoing circumstances, high-purity tungsten having low resistivity and stable thermal and chemical characteristics is being used as the electrode material or the wiring material.

The foregoing electrode material or wiring material for VLSI is generally produced by way of the sputtering method or the CVD method, but the sputtering method is being widely used in comparison to the CVD method since the structure and operation of the equipment are relatively simple, deposition can be performed easily, and the process is of low cost.

While a tungsten target is demanded of high purity and high density, in recent years, as an electrode material or a wiring material for VLSI, a material with even lower electrical resistivity is being demanded in a film deposited by sputtering a tungsten target.

As described later, a tungsten sintered compact target is capable of attaining higher purity and high densification, and, while there are disclosures for achieving such higher purity and high densification, research and development regarding the abnormal grain growth of tungsten and deterioration in the target strength have not been conducted.

Conventionally, a tungsten sintered compact sputtering target was produced via pressure sintering using a graphite die. For example, this conventional method is described in Patent Document 1, Patent Document 2, and Patent Document 3. In the foregoing case, there is a possibility that C, as an impurity, will inevitably get mixed into tungsten. Moreover, while the type of die used is not particularly specified, Patent Document 4 and Patent Document 5 describe methods of achieving higher density.

The foregoing Patent Documents mainly aim to achieve the higher density of a tungsten target.

Otherwise, Patent Document 6 describes lowering the C content in a tungsten sintered compact target, and specifically discloses reducing the carbon content to be 50 ppm or less (the most reduced C content was 19 ppm in the Examples).

Moreover, Patent Document 7 discloses a technique of reducing the C content in a metal material (the most reduced C content was 10 ppm in the Examples) aiming to achieve the uniformity of the film and reduction of dust generation.

Moreover, Patent Document 8 discloses a technique of causing the C content to be 30 ppm or less (the most reduced C content was 6 ppm in the Examples) for producing a high-purity and high-density tungsten sintered compact target.

Meanwhile, it was discovered that there is a problem in that abnormal grain growth and deterioration in target strength occur during the production stage of a tungsten sintered compact sputtering target and consequently deteriorate the product yield. As a method of resolving this problem, the present Applicant discovered that the inclusion of phosphorus significantly affects the abnormal grain growth of tungsten and deterioration in target strength, and proposed causing the phosphorus contained in the tungsten to be 1 ppm or less as described in Patent Document 3.

Consequently, it became possible to prevent the abnormal grain growth of tungsten and improve the target product yield, and at that stage Patent Document 3 was an extremely effective method.

Nevertheless, while it was extremely effective to reduce the phosphorus contained in the tungsten, strictly speaking, abnormal grain growth still occurred, and additional improvement was required.

Generally speaking, a sintered compact is prepared via HIP in order to attain higher density and higher strength of the tungsten target, but since abnormal grain growth at this stage causes the problem of processing defects in the post-processing, there is a task of further reducing abnormal grain growth.

Other than the foregoing Patent Documents, Patent Document 9 describes adjusting the grain size and crystal structure via rotary forging, but the object of Patent Document 9 is not to prevent the abnormal grain growth of tungsten, and under the current circumstances there are no specific means for preventing abnormal grain growth.

Patent Document 1: JP 3086447 B
Patent Document 2: JP 2001-098364 A
Patent Document 3: WO 2009/147900
Patent Document 4: JP 2005-171389 A
Patent Document 5: JP 2007-314883 A
Patent Document 6: JP H05-093267 A
Patent Document 7: JP 2001-335923 A
Patent Document 8: JP H07-076771 A
Patent Document 9: JP 2012-180599 A

SUMMARY

In light of the foregoing points, there is a problem in that abnormal grain growth and deterioration in target strength occur during the production stage of a tungsten sintered compact sputtering target and consequently deteriorate the product yield. An object of this invention is to inhibit abnormal grain growth of tungsten and deterioration in target strength.

In order to achieve the foregoing object, the present inventors provide the following invention.

1) A tungsten sintered compact sputtering target containing iron as an impurity in an amount of 0.8 wtppm or less, and remainder being tungsten and other unavoidable impurities, wherein a range of iron concentration in a target structure is within a range of ±0.1 wtppm of an average concentration.
2) The tungsten sintered compact sputtering target according to 1) above, wherein a relative density of the target is 99% or higher, an average crystal grain size is 50 μm or less, and a crystal grain size range is 5 to 200 μm.
3) The tungsten sintered compact sputtering target according to 1) or 2) above, wherein a purity of tungsten excluding gas components is 5N (99.999%) or higher.
4) The tungsten sintered compact sputtering target according to 3) above, wherein contents of oxygen and carbon are respectively 50 wtppm or less.

As a result of producing a tungsten sintered compact sputtering target containing iron as an impurity in an amount of 0.8 wtppm or less, and remainder being tungsten and other unavoidable impurities, the present invention yields a superior effect of being able to inhibit abnormal grain growth and deterioration in target strength during the production stage of the tungsten sintered compact sputtering target. Consequently, the present invention yields an effect of being able to reduce the problem of processing defects that occur in the post-processing, and improve the product yield.

BRIEF DESCRIPTION OF DRAWINGS

FIG. 1 It is a schematic explanatory diagram showing 17 measurement points in total for iron concentration measurement.

DETAILED DESCRIPTION

The tungsten sintered compact sputtering target of the present invention is unique in that it contains iron as an impurity in an amount of 0.8 wtppm or less, and remainder being tungsten and other unavoidable impurities. The iron content is limited to be an extremely small amount, and this is extremely important in the present invention. It is thereby possible to yield the effect of being able to inhibit abnormal grain growth and deterioration in target strength, and effectively prevent the occurrence of defects in subsequent processing. It is even more effective to cause the content of iron as an impurity to be 0.5 wtppm or less.

It is particularly effective to cause the relative density to be 99% or higher, the average crystal grain size to be 50 μm or less, and the crystal grain size to be 5 to 200 μm in order to maintain the strength of the tungsten sintered compact sputtering target.

The tungsten sintered compact sputtering target of the present invention preferably has a purity of 5N (99.999%) or higher. This purity level is effective in maintaining the strength of the tungsten sintered compact sputtering target. With the tungsten sintered compact sputtering target of the present invention, the range of iron concentration in the target structure needs to be within the range of ±0.1 wtppm of the average concentration.

This is because, even if the content of iron as an impurity contained in the tungsten is caused to be 0.8 wtppm or less in the target, when there is segregation in the target structure, the segregation spot in the structure tends to become the source of abnormal grain growth. Inhibition of the foregoing variation is effective in reducing the foregoing problems.

In addition, it is effective to cause the contents of hydrogen, carbon, nitrogen, oxygen and sulfur, which are gas components, to be respectively 50 wtppm or less in order to similarly maintain the strength of the tungsten sintered compact sputtering target.

When producing a tungsten sintered compact sputtering target, a tungsten raw material powder in which the content of iron as an impurity is 0.8 wtppm or less is used, and sufficiently mixed so that variation in the Fe content becomes small. This mixing may be performed, for example, using a ball mill or a V-type mixer. The iron concentration in the raw material powder should be suppressed to be 0.8 wtppm or less based on ICP analysis. In particular, preferably, the raw material powder is divided into 25 portions, each portion is subject to analysis, and the range of variation in the analytical value of iron is within the range of ±0.1 wtppm of the average concentration.

It is thereby possible to cause the range of iron concentration in the target structure to be within the range of ±0.1 wtppm of the average concentration. Since the content of Fe in the tungsten is low, variation in the Fe content can be inhibited and uniformized mainly by sufficiently mixing the raw material powder. Specifically, it is effective to measure the iron concentration based on the following conditions and arbitrarily set the compatible production conditions so as to control the variation in the stationary iron concentration in the tungsten target structure. In this respect, a clear process of measuring and controlling the variation of the iron concentration in the target structure is important.

With regard to the measurement of iron concentration in the target, for instance, in the case of a disk-shaped tungsten target, measurement is performed at 17 points (1 point is the center). In other words, as shown in FIG. 1, the iron concentration is measured at a total of 17 points; specifically, the center, 8 equally-spaced points on ½ R (radius), and 8 equally-spaced points on the outer periphery.

The tungsten raw material powder adjusted as described above of which average grain size is roughly 1 μm is filled in a carbon die, hot pressed at a temperature of 1500 to 1800° C., and thereafter subject to HIP treatment at a temperature of 1600 to 1850° C. and a pressure of 1700 to 1800 kgf for 3 to 4 hours to produce the tungsten sintered compact sputtering target of the present invention. The foregoing HIP treatment conditions are conditions that are normally adopted, and HIP treatment may also be performed outside the range of the foregoing conditions as needed. It is thereby possible to achieve an average grain size of 20 to 30 μm and a relative density of 99%.

Nevertheless, since the tungsten sintered compact sputtering target is produced using a carbon die, a large amount of carbon (C) will be included, as an impurity, within the sintered compact target. In the foregoing case, as the C content increases, the specific resistance of the tungsten film after the sputter deposition tends to increase. Thus, the content of carbon as a gas component should be reduced to 50 wtppm or less.

Since oxygen bonds with the impurities contained in the tungsten to form oxides, it is desirable to simultaneously reduce oxygen. Moreover, the gas component of oxygen also reacts with tungsten to also form an oxide. Thus, the oxygen content should be reduced to 50 wtppm or less.

Moreover, the total impurity concentration excluding gas components is preferably 4 wtppm or less, more preferably 3 wtppm or less, and most preferably 2 ppm or less.

Since impurities excluding gas components get mixed into the LSI wiring material during sputter deposition and cause the deterioration in the function of the tungsten wiring, it could be said that such impurities should be reduced as much as possible. Moreover, the foregoing reduction of carbon, oxygen and iron additionally yields the effect of uniformizing the structure and inhibiting the generation of cracks and fractures of the target. In addition, this tungsten sintered compact sputtering target can be used for depositing a film on a substrate, and is effective for producing a semiconductor device.

During sintering, it is effective to perform hot press (HP) at a temperature exceeding 1500° C. Moreover, after the hot press, HIP treatment can be performed at a temperature exceeding 1600° C. in order to further improve the density.

Moreover, it is possible to provide a tungsten sintered compact sputtering target having a relative density of 99% or higher, and even 99.5% or higher. Improvement of density is favorable since it can increase the strength of the target.

Accordingly, the target structure becomes uniform in the radial direction and thickness direction of the target, and the strength of the target is sufficient. Thereby, the problem of the target cracking during operation or use can be eliminated, and it becomes possible to improve the production yield of the target.

As described above, the content of iron as an impurity can be reduced to be 0.8 wtppm or less, and even 0.5 wtppm or less. It is thereby possible to yield the effect of being able to inhibit abnormal grain growth and deterioration in target strength, and effectively prevent the occurrence of defects in the subsequent processing.

As described above, the sputtering target of the present invention can maintain the density at a high level, reduce holes and cause the crystal grains to become refined to achieve the uniform and smooth sputtered surface of the target. Thus, the sputtering target of the present invention yields the effect of being able to reduce the generation of particles and nodules during the sputtering process and additionally extend the target life, and additionally yields the effect of being able to reduce the variation in quality and improve mass productivity.

EXAMPLES

The present invention is now explained based on the Examples and Comparative Examples. These Examples are merely illustrative, and the present invention shall in no way be limited thereby. In other words, the present invention is only limited by the scope of claims and, as a matter of course, shall cover various modifications and embodiments other than Examples below.

Example 1

A refined W (tungsten) powder was sufficiently mixed to prepare a W powder to attain an average Fe concentration of 0.4 wtppm and a range of Fe concentration of 0.3 to 0.5 wtppm (25-portion measurement), and the prepared W powder was hot pressed at a temperature of 1800° C. and a pressure of 200 kgf.

Subsequently, the obtained product was subject to HIP under the following conditions; namely, a temperature of 1700° C. and a pressure of 1800 kgf for 3.0 hours. The thus produced tungsten target was free from grain growth that would lead to a processing defect.

With this sputtering target, it was possible to maintain an average Fe concentration of 0.4 wtppm, and a range of Fe concentration of 0.3 to 0.5 wtppm (17-point measurement).

The P content was 0.5 wtppm or less, the average crystal grain size was 20 μm, the average crystal grain size range was 15 to 25 μm, the total impurity concentration was 1.001 wtppm, the content of oxygen as a gas component was 30 wtppm, and the carbon content was 20 wtppm. This tungsten target satisfied the conditions of the present invention. In addition, the target was free from abnormal grain growth and deterioration in target strength, and furthermore the subsequent workability was favorable.

Note that the grain size was measured by polishing and etching W and observing the structure with an optical microscope. In other words, on the structure photograph of one microscopic field, two straight lines were drawn both in the vertical direction and in the horizontal direction, the number of grain boundaries intersecting with these lines was counted, and the grain size was determined by dividing the total length of these four lines by the number of grain boundaries intersecting with these lines (crosscut method). The grain size of the largest grain and the grain size of the smallest grain in one microscopic field of the structure were measured, and a range of the result values is defined as the range. The measurement locations were 17 points. The same method was adopted for measuring the grain size in the following Examples and Comparative Examples.

In particular, the crystal grain size considerably affects the workability. For example, a normal turning process is enabled when the average crystal grain size is small; but if the grain size is large, grains tend to fall off, and there is a problem in that a smooth surface cannot be obtained in the structure after being subject to the turning process. When numerous grains fall off, that location may become the source of cracks, and there are cases where the process itself cannot be performed. The same applies to the following Examples and Comparative Examples. The results are shown in Table 1.

TABLE 1

| | Average Fe concentration (wtppm) | Range of Fe concentration (wtppm) | HIP conditions | | | Average crystal grain size (μm) | Range of average crystal grain size (μm) | Total impurity concentration (wtppm) | Oxygen content (wtppm) | Carbon content (wtppm) | Workability |
| --- | --- | --- | --- | --- | --- | --- | --- | --- | --- | --- | --- |
| | | | Temperature (° C.) | Pressure (kgf) | Holding time (hr) | | | | | | |
| Example 1 | 0.4 | 0.3 to 0.5 | 1700 | 1800 | 3.0 | 20 | 15-25 | 1.001 | 30 | 20 | ○ |
| Example 2 | 0.7 | 0.6 to 0.8 | 1750 | 1700 | 4.0 | 25 | 20-30 | 1.003 | 20 | 20 | ○ |
| Example 3 | 0.8 | 0.7 to 0.9 | 1750 | 1700 | 4.0 | 30 | 20-35 | 1.013 | 20 | 20 | ○ |
| Example 4 | 0.7 | 0.6 to 0.8 | 1770 | 1770 | 2.0 | 50 | 5-200 | 1.003 | 30 | 30 | ○ |
| Comparative Example 1 | 1.0 | 0.9 to 1.1 | 1700 | 1800 | 8.0 | 800 | 600-1000 | 1.005 | 30 | 30 | x |
| Comparative Example 2 | 0.4 | 0.2 to 0.8 | 1750 | 1700 | 6.0 | 500 | 400-650 | 1.002 | 30 | 20 | x |
| Comparative Example 3 | 0.7 | 0.4 to 0.9 | 1700 | 1400 | 3.0 | 700 | 500-850 | 1.001 | 20 | 20 | x |
| Comparative Example 4 | 1.0 | 0.9 to 1.1 | 1750 | 1500 | 4.0 | 900 | 800-1000 | 5.201 | 40 | 40 | x |
| Comparative Example 5 | 0.7 | 0.4 to 0.9 | 1600 | 1800 | 3.0 | 900 | 850-950 | 4.606 | 120 | 20 | x |
| Comparative Example 6 | 0.4 | 0.2 to 0.8 | 1500 | 1700 | 4.0 | 800 | 700-900 | 4.293 | 30 | 160 | x |

Example 2

A refined W powder was sufficiently mixed to prepare a W powder to attain an average Fe concentration of 0.7 wtppm and a range of Fe concentration of 0.6 to 0.8 wtppm (25-portion measurement), and the prepared W powder was hot pressed at a temperature of 1800° C. and a pressure of 200 kgf.

Subsequently, the obtained product was subject to HIP under the following conditions; namely, a temperature of 1750° C. and a pressure of 1700 kgf for 4.0 hours. The thus produced tungsten target was free from grain growth that would lead to a processing defect.

With this sputtering target, it was possible to maintain an average Fe concentration of 0.7 wtppm, and a range of Fe concentration of 0.6 to 0.8 wtppm (17-point measurement).

The P content was 0.5 wtppm or less, the average crystal grain size was 25 μm, the average crystal grain size range was 20 to 30 μm, the total impurity concentration was 1.003 wtppm, the content of oxygen as a gas component was 20 wtppm, and the carbon content was 20 wtppm. This tungsten target satisfied the conditions of the present invention. In addition, the target was free from abnormal grain growth and deterioration in target strength, and furthermore the subsequent workability was favorable. The results are similarly shown in Table 1.

Example 3

A refined W powder was sufficiently mixed to prepare a W powder to attain an average Fe concentration of 0.8 wtppm and a range of Fe concentration of 0.7 to 0.9 wtppm (25-portion measurement), and the prepared W powder was hot pressed at a temperature of 1800° C. and a pressure of 200 kgf.

Subsequently, the obtained product was subject to HIP under the following conditions; namely, a temperature of 1750° C. and a pressure of 1700 kgf for 4.0 hours. The thus produced tungsten target was free from grain growth that would lead to a processing defect.

With this sputtering target, it was possible to maintain an average Fe concentration of 0.8 wtppm, and a range of Fe concentration of 0.7 to 0.9 wtppm (17-point measurement).

The P content was 0.5 wtppm or less, the average crystal grain size was 30 μm, the average crystal grain size range was 20 to 35 μm, the total impurity concentration was 1.013 wtppm, the content of oxygen as a gas component was 20 wtppm, and the carbon content was 20 wtppm. This tungsten target satisfied the conditions of the present invention. In addition, the target was free from abnormal grain growth and deterioration in target strength, and furthermore the subsequent workability was favorable. The results are similarly shown in Table 1.

Example 4

A refined W powder was sufficiently mixed to prepare a W powder to attain an average Fe concentration of 0.7 wtppm and a range of Fe concentration of 0.6 to 0.8 wtppm (25-portion measurement), and the prepared W powder was hot pressed at a temperature of 1800° C. and a pressure of 200 kgf.

Subsequently, the obtained product was subject to HIP under the following conditions; namely, a temperature of 1770° C. and a pressure of 1770 kgf for 2.0 hours. The thus produced tungsten target was free from grain growth that would lead to a processing defect.

With this sputtering target, it was possible to maintain an average Fe concentration of 0.7 wtppm, and a range of Fe concentration of 0.6 to 0.8 wtppm (17-point measurement).

The P content was 0.5 wtppm or less, the average crystal grain size was 50 μm, the average crystal grain size range was 5 to 200 μm, the total impurity concentration was 1.003 wtppm, the content of oxygen as a gas component was 30 wtppm, and the carbon content was 30 wtppm. This tungsten target satisfied the conditions of the present invention. In addition, the target was free from abnormal grain growth and deterioration in target strength, and furthermore the subsequent workability was favorable. The results are similarly shown in Table 1.

Comparative Example 1

A W powder having an average Fe concentration of 1.0 wtppm was prepared. The range of Fe concentration was 0.9 to 1.1 wtppm (25-portion measurement). The prepared W powder was hot pressed at a temperature of 1800° C. and a pressure of 200 kgf, and the obtained product was subsequently subject to HIP under the following conditions; namely, a temperature of 1700° C. and a pressure of 1800 kgf for 8.0 hours. Consequently, grain growth that would lead to a processing defect occurred.

With this sputtering target, the average Fe concentration was 1.0 wtppm, and the range of Fe concentration was 0.9 to 1.1 wtppm (17-point measurement). Thus this sputtering target failed to satisfy the conditions of the present invention.

The P content was 0.5 wtppm or less, the average crystal grain size was 800 μm, the average crystal grain size range was 600 to 1000 μm, the total impurity concentration was 1.005 wtppm, the content of oxygen as a gas component was 30 wtppm, and the carbon content was 30 wtppm. From a comprehensive perspective, this sputtering target failed to satisfy the conditions of the present invention. In particular, the average crystal grain size and the average crystal grain size range had considerably deviated from the conditions of the present invention. Consequently, abnormal grain growth was observed in the target, the strength of the target deteriorated, and the subsequent workability was inferior. The results are similarly shown in Table 1.

Comparative Example 2

A W powder having an average Fe concentration of 0.4 wtppm was prepared. The range of Fe concentration was 0.2 to 0.8 wtppm (25-portion measurement). The prepared W powder was hot pressed at a temperature of 1800° C. and a pressure of 200 kgf, and the obtained product was subsequently subject to HIP under the following conditions; namely, a temperature of 1750° C. and a pressure of 1700 kgf for 6.0 hours. Consequently, grain growth that would lead to a processing defect occurred.

With this sputtering target, the average Fe concentration was 0.4 wtppm, the range of Fe concentration was 0.2 to 0.8 wtppm (17-point measurement), and variation in the maximum-minimum range was considerable and failed to satisfy the conditions of the present invention.

The P content was 0.5 wtppm or less, the average crystal grain size was 500 μm, the average crystal grain size range was 400 to 650 μm, the total impurity concentration was 1.002 wtppm, the content of oxygen as a gas component was 30 wtppm, and the carbon content was 20 wtppm. From a comprehensive perspective, this sputtering target failed to satisfy the conditions of the present invention. In particular, the average crystal grain size and the average crystal grain size range had considerably deviated from the conditions of the present invention. Consequently, abnormal grain growth was observed in the target, the strength of the target deteriorated, and the subsequent workability was inferior. The results are similarly shown in Table 1.

Comparative Example 3

A W powder having an average Fe concentration of 0.7 wtppm was prepared. The range of Fe concentration was 0.4 to 0.9 wtppm (25-portion measurement). The prepared W powder was hot pressed at a temperature of 1800° C. and a pressure of 200 kgf, and the obtained product was subsequently subject to HIP under the following conditions; namely, a temperature of 1700° C. and a pressure of 1400 kgf for 3.0 hours. Consequently, grain growth that would lead to a processing defect occurred.

With this sputtering target, the average Fe concentration was 0.7 wtppm, the range of Fe concentration was 0.4 to 0.9 wtppm (17-point measurement), and variation in the maximum-minimum range was considerable and failed to satisfy the conditions of the present invention.

The P content was 0.5 wtppm or less, the average crystal grain size was 700 µm, the average crystal grain size range was 500 to 850 µm, the total impurity concentration was 1.001 wtppm, the content of oxygen as a gas component was 20 wtppm, and the carbon content was 20 wtppm. From a comprehensive perspective, this sputtering target failed to satisfy the conditions of the present invention. In particular, the average crystal grain size and the average crystal grain size range had considerably deviated from the conditions of the present invention. Consequently, abnormal grain growth was observed in the target, the strength of the target deteriorated, and the subsequent workability was inferior. The results are similarly shown in Table 1.

Comparative Example 4

A W powder having an average Fe concentration of 1.0 wtppm was prepared. The range of Fe concentration was 0.9 to 1.1 wtppm (25-portion measurement). The prepared W powder was hot pressed at a temperature of 1800° C. and a pressure of 200 kgf, and the obtained product was subsequently subject to HIP under the following conditions; namely, a temperature of 1750° C. and a pressure of 1500 kgf for 4.0 hours. Consequently, grain growth that would lead to a processing defect occurred.

With this sputtering target, the average Fe concentration was 1.0 wtppm, and the range of Fe concentration was 0.9 to 1.1 wtppm (17-point measurement). The average Fe concentration failed to satisfy the condition of the present invention.

The P content was 0.5 wtppm or less, the average crystal grain size was 900 µm, the average crystal grain size range was 800 to 1000 µm, the total impurity concentration was 5.201 wtppm, the content of oxygen as a gas component was 40 wtppm, and the carbon content was 40 wtppm. From a comprehensive perspective, this sputtering target failed to satisfy the conditions of the present invention. In particular, the average crystal grain size and the average crystal grain size range had considerably deviated from the conditions of the present invention. Consequently, abnormal grain growth was observed in the target, the strength of the target deteriorated, and the subsequent workability was inferior. The results are similarly shown in Table 1.

Comparative Example 5

A W powder having an average Fe concentration of 0.7 wtppm was prepared. The range of Fe concentration was 0.4 to 0.9 wtppm (25-portion measurement). The prepared W powder was hot pressed at a temperature of 1800° C. and a pressure of 200 kgf, and the obtained product was subsequently subject to HIP under the following conditions; namely, a temperature of 1600° C. and a pressure of 1800 kgf for 3.0 hours. Consequently, grain growth that would lead to a processing defect occurred.

With this sputtering target, the average Fe concentration was 0.7 wtppm, the range of Fe concentration was 0.4 to 0.9 wtppm (17-point measurement), and variation in the range of Fe concentration was considerable and failed to satisfy the condition of the present invention.

The P content was 0.5 wtppm or less, the average crystal grain size was 900 µm, the average crystal grain size range was 850 to 950 µm, the total impurity concentration was 4.606 wtppm, the content of oxygen as a gas component was 120 wtppm, and the carbon content was 20 wtppm. From a comprehensive perspective, this sputtering target failed to satisfy the conditions of the present invention. In particular, the average crystal grain size, the average crystal grain size range and the oxygen content had considerably deviated from the conditions of the present invention. Consequently, abnormal grain growth was observed in the target, the strength of the target deteriorated, and the subsequent workability was inferior. The results are similarly shown in Table 1.

Comparative Example 6

A W powder having an average Fe concentration of 0.4 wtppm was prepared. The range of Fe concentration was 0.2 to 0.8 wtppm (25-portion measurement). The prepared W powder was hot pressed at a temperature of 1800° C. and a pressure of 200 kgf, and the obtained product was subsequently subject to HIP under the following conditions; namely, a temperature of 1500° C. and a pressure of 1700 kgf for 4.0 hours. Consequently, grain growth that would lead to a processing defect occurred.

With this sputtering target, the average Fe concentration was 0.4 wtppm, the range of Fe concentration was 0.2 to 0.8 wtppm (17-point measurement), and variation in the range of Fe concentration was considerable and failed to satisfy the condition of the present invention.

The P content was 0.5 wtppm or less, the average crystal grain size was 800 µm, the average crystal grain size range was 700 to 900 µm, the total impurity concentration was 4.293 wtppm, the content of oxygen as a gas component was 30 wtppm, and the carbon content was 160 wtppm. From a comprehensive perspective, this sputtering target failed to satisfy the conditions of the present invention. In particular, the average crystal grain size, the average crystal grain size range and the carbon content had considerably deviated from the conditions of the present invention. Consequently, abnormal grain growth was observed in the target, the strength of the target deteriorated, and the subsequent workability was inferior. The results are similarly shown in Table 1.

The present invention provides a tungsten sintered compact sputtering target containing iron as an impurity contained in tungsten in an amount of 0.8 wtppm or less, and remainder being tungsten and other unavoidable impurities. The present invention is thereby possible to yield a superior effect of being able to inhibit abnormal grain growth and deterioration in target strength during the production stage of the tungsten sintered compact sputtering target. Consequently, the present invention yields an effect of being able to reduce the problem of processing defects that occur in the post-processing, and improve the product yield.

Moreover, by depositing a film using this tungsten sintered compact sputtering target, the deposited tungsten film yields a superior effect of being able to stably reduce electrical resistivity. Accordingly, the tungsten sintered compact sputtering target of the present invention is effective in forming an LSI wiring film.

The invention claimed is:
1. A tungsten sintered compact sputtering target consisting of tungsten, impurities excluding gas components, and gas components consisting of oxygen, carbon, hydrogen, nitrogen and sulfur, wherein the sputtering target has a sintered structure such that an average content of iron as an impurity in the sintered structure is in an amount of 0.4 to 0.8 wtppm, a content of iron varies from location to location within the sputtering target by an amount of ±0.1 wtppm about the average content of iron, and the sputtering target has a relative density of 99% or higher, an average crystal grain size of about 20-50 μm, a crystal grain size ranging from 5 to 200 pm, a concentration of impurities in total excluding gas components of about 1.001-1.013 wtppm, and a content for each of oxygen, carbon, hydrogen, nitrogen and sulfur of 50 wtppm or less, wherein oxygen and carbon are each between about 20-30 wtppm.

\* \* \* \* \*